United States Patent
Eun

(10) Patent No.: US 7,713,887 B2
(45) Date of Patent: May 11, 2010

(54) METHOD FOR FORMING ISOLATION LAYER IN SEMICONDUCTOR DEVICE

(75) Inventor: Byung Soo Eun, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 12 days.

(21) Appl. No.: 11/761,594

(22) Filed: Jun. 12, 2007

(65) Prior Publication Data

US 2007/0232021 A1   Oct. 4, 2007

(30) Foreign Application Priority Data

Dec. 7, 2006   (KR) .................... 10-2006-0123965

(51) Int. Cl.
  *H01L 21/31*   (2006.01)
(52) U.S. Cl. .................. 438/787; 438/424; 438/427; 438/435; 438/437; 438/241; 438/258; 438/296; 438/309; 257/774; 257/382; 257/751; 257/756; 257/377; 257/302; 257/301; 257/296
(58) Field of Classification Search ............... 438/424, 438/427, 435, 437
See application file for complete search history.

(56) References Cited

U.S. PATENT DOCUMENTS

| | | | | | |
|---|---|---|---|---|---|
| 4,666,556 A | * | 5/1987 | Fulton et al. | ............... | 438/431 |
| 4,900,692 A | * | 2/1990 | Robinson | ................ | 438/421 |
| 5,216,266 A | * | 6/1993 | Ozaki | ................. | 257/302 |
| 5,445,988 A | * | 8/1995 | Schwalke | .............. | 438/432 |
| 5,496,765 A | * | 3/1996 | Schwalke | .............. | 438/404 |
| 5,569,961 A | * | 10/1996 | Lee | ................... | 257/751 |
| 5,572,071 A | * | 11/1996 | Lee | ................... | 257/751 |
| 5,581,110 A | * | 12/1996 | Razouk et al. | ........... | 257/513 |
| 5,604,149 A | * | 2/1997 | Paoli et al. | .............. | 438/437 |
| 5,719,085 A | * | 2/1998 | Moon et al. | .............. | 438/424 |
| 5,811,315 A | * | 9/1998 | Yindeepol et al. | ......... | 438/405 |
| 5,843,842 A | * | 12/1998 | Lee et al. | ............... | 438/688 |
| 5,894,169 A | * | 4/1999 | Givens et al. | ............ | 257/774 |
| 5,946,593 A | * | 8/1999 | Saitoh | ................ | 438/640 |
| 6,074,954 A | * | 6/2000 | Lill et al. | ............... | 438/710 |

(Continued)

FOREIGN PATENT DOCUMENTS

KR   10-2005-0003011   1/2005

(Continued)

*Primary Examiner*—Fernando L Toledo
*Assistant Examiner*—Ankush k Singal
(74) *Attorney, Agent, or Firm*—Marshall, Gerstein & Borun LLP

(57) ABSTRACT

A method for forming an isolation layer in a semiconductor device includes forming a trench in a semiconductor substrate, forming a first liner nitride layer on an exposed surface of the trench, forming a first high density plasma (HDP) oxide layer such that the first HDP oxide layer partially fills the trench to cover a bottom surface and a side surface of the trench and an upper surface of the first liner nitride layer, etching overhangs generated during the forming of the first HDP oxide layer by introducing a hydrofluoric acid (HF) solution into the semiconductor substrate, forming a second liner nitride layer over the first HDP oxide layer, removing the second liner nitride layer formed on the first HDP oxide layer while forming a second HDP oxide layer to fill the trench, and subjecting the second HDP oxide layer to planarization, so as to form a trench isolation layer.

7 Claims, 6 Drawing Sheets

U.S. PATENT DOCUMENTS

| | | | |
|---|---|---|---|
| 6,114,764 A * | 9/2000 | Hoshino et al. | 257/751 |
| 6,121,148 A * | 9/2000 | Bashir et al. | 438/692 |
| 6,140,223 A * | 10/2000 | Kim et al. | 438/629 |
| 6,177,348 B1 * | 1/2001 | Gambino et al. | 438/677 |
| 6,262,448 B1 * | 7/2001 | Enders et al. | 257/302 |
| 6,284,665 B1 * | 9/2001 | Lill et al. | 438/710 |
| 6,365,524 B1 * | 4/2002 | Chen et al. | 438/700 |
| 6,518,145 B1 * | 2/2003 | Alsmeier et al. | 438/425 |
| 6,589,865 B2 * | 7/2003 | Dixit et al. | 438/637 |
| 6,812,115 B2 * | 11/2004 | Wieczorek et al. | 438/424 |
| 6,821,865 B2 * | 11/2004 | Wise et al. | 438/435 |
| 6,825,097 B2 * | 11/2004 | Beyer et al. | 438/424 |
| 6,906,420 B2 * | 6/2005 | Harada | 257/754 |
| 6,908,831 B2 * | 6/2005 | O'Riain et al. | 438/435 |
| 6,946,387 B2 * | 9/2005 | Wada et al. | 438/629 |
| 6,958,275 B2 * | 10/2005 | Metzler | 438/270 |
| 7,052,970 B2 * | 5/2006 | Radecker | 438/435 |
| 7,097,886 B2 * | 8/2006 | Moghadam et al. | 427/569 |
| 2001/0007797 A1 * | 7/2001 | Jang et al. | 438/761 |
| 2002/0182819 A1 * | 12/2002 | Schrems et al. | 438/386 |
| 2003/0071321 A1 * | 4/2003 | Hong | 257/499 |
| 2003/0077872 A1 * | 4/2003 | Tews et al. | 438/386 |
| 2005/0118784 A1 | 6/2005 | Kim | |
| 2005/0287761 A1 * | 12/2005 | Weng | 438/424 |
| 2006/0178003 A1 * | 8/2006 | Krishnaraj et al. | 438/627 |
| 2007/0037361 A1 | 2/2007 | Park | |

FOREIGN PATENT DOCUMENTS

| | | |
|---|---|---|
| KR | 10-2006-0083249 | 7/2006 |
| KR | 10-0621888 B1 | 9/2006 |
| KR | 10-2006-0105857 | 10/2006 |
| KR | 10-2006-0119194 | 11/2006 |

\* cited by examiner

He/O$_2$

METHOD FOR FORMING ISOLATION LAYER IN SEMICONDUCTOR DEVICE

CROSS-REFERENCES TO RELATED APPLICATIONS

The present application claims priority to Korean patent application number 10-2006-123965, filed on Dec. 7, 2006, which is incorporated by reference in its entirety.

BACKGROUND OF THE INVENTION

The present invention relates to a semiconductor device, and more specifically, to a method for forming an isolation layer in a semiconductor device, which can prevent attacks on a liner nitride layer in the course of forming an isolation layer.

In recent trends toward high-integration and fine-pattern of semiconductor memory devices such as dynamic random access memory (DRAM) devices, there has been increased the importance of a shallow trench isolation (STI) layer that exhibits a superior device isolation performance with a small width. It is known that the shallow trench isolation layer has an effect on the characteristics of DRAM devices, for example, a data retention time. In particular, a liner nitride layer is applied to the trench isolation layer, to improve the refresh characteristics of DRAM devices.

It will be appreciated that a method for forming a trench isolation layer comprises: forming a trench in a semiconductor substrate by a predetermined depth; forming a buffer layer, a liner nitride layer, and a liner oxide layer on a sidewall of the trench; and depositing an insulating layer to fill the trench.

The insulating layer to fill the trench is formed by repeating deposition-etching-deposition (DED), for the purpose of improving gap-fill characteristics. With the repetition of deposition and etching, overhangs, which are generated in the upper region of the trench in the course of depositing the insulating layer in the trench having a small width, can be removed by etching, thus resulting in an enhancement in the gap-fill characteristics of the trench. However, the repetition of deposition and etching has a limit to fill a trench having a low gap-fill margin due to the reduced size thereof.

FIG. 1 is illustrating defects in a trench isolation layer according to the prior art.

Referring to FIG. 1, it can be appreciated that, if a portion of the trench is exposed by etching that is carried out to remove overhangs generated during deposition of an insulating layer, a liner nitride layer on the exposed portion (as designated by the dotted circle A) of the trench is attacked by an etching solution. If the liner nitride layer is attacked, the liner nitride layer has defects such as pin holes, and the density of the liner nitride layer may be changed loosely.

The liner nitride layer having the loosely changed density cannot completely protect a semiconductor substrate from an oxidant source during the following oxidation process. Thereby, an unwanted oxidized portion further occurs in the semiconductor substrate by the oxidant source. The oxidized portion causes a stress during the fabrication of a device, and consequently may cause the leakage of current and a reduction of data retention time. Further, the liner nitride layer having the loosely changed density has a problem that impurities inside an active region may leak out in the following thermal process, to thereby be diffused into the isolation layer. If the diffusion of impurities into the isolation layer occurs, a cell threshold voltage (Vth) is changed, therefore the electric characteristics of a transistor may be deteriorated.

BRIEF SUMMARY OF THE INVENTION

A method for forming an isolation layer in a semiconductor device, can prevent defects due to attacks on a liner nitride layer in the course of forming an isolation layer, thereby improving the electric characteristics of a transistor.

A method for forming an isolation layer in a semiconductor device comprising: forming a trench in a semiconductor substrate; forming a first liner nitride layer on an exposed surface of the trench; forming a first high density plasma (HDP) oxide layer such that the first HDP oxide layer partially fills the trench to cover a bottom surface and a side surface of the trench and an upper surface of the first liner nitride layer; etching overhangs generated during the forming of the first HDP oxide layer by introducing a hydrofluoric acid (HF) solution into the semiconductor substrate; forming a second liner nitride layer over the first HDP oxide layer; removing the second liner nitride layer formed over the first HDP oxide layer while forming a second HDP oxide layer to fill the trench; and subjecting the second HDP oxide layer to planarization, so as to form a trench isolation layer.

The method may further comprise, prior to the forming of the second HDP oxide layer, preheating the semiconductor substrate.

The preheating may comprise: first preheating by introducing argon (Ar)-containing inert gas into the semiconductor substrate; and second preheating by introducing oxygen ($O_2$) gas into the semiconductor substrate.

The forming of the first HDP oxide layer may comprise: loading the semiconductor substrate in a high density plasma chamber; depositing a liner high density plasma (HDP) oxide layer over the trench; introducing a deposition source into the high density plasma chamber, to form a bulk HDP oxide layer; introducing an etching source into the high density plasma chamber, to etch overhangs generated during the forming of the bulk HDP oxide layer; and repeating the deposition of the liner HDP oxide layer, the introduction of the deposition source, and the introduction of the etching source, to form the first HDP oxide layer partially filling the trench.

The forming of the second liner nitride layer may comprise: annealing the semiconductor substrate in an ammonia ($NH_3$) gas atmosphere; and introducing a deposition source containing nitrogen gas, dichlorosilane gas, and ammonia gas into the semiconductor substrate, so as to form the second liner nitride layer.

The removal of the second liner nitride layer formed over the first HDP oxide layer may be carried out by introducing helium (He) gas and oxygen ($O_2$) gas by applying a power of 4,000 to 5,000 W at a low frequency to generate plasma and a power of 200 to 400 W at a high frequency to allow the plasma to be adsorbed onto the semiconductor substrate.

DETAILED DESCRIPTION OF THE INVENTION

Figure 1:
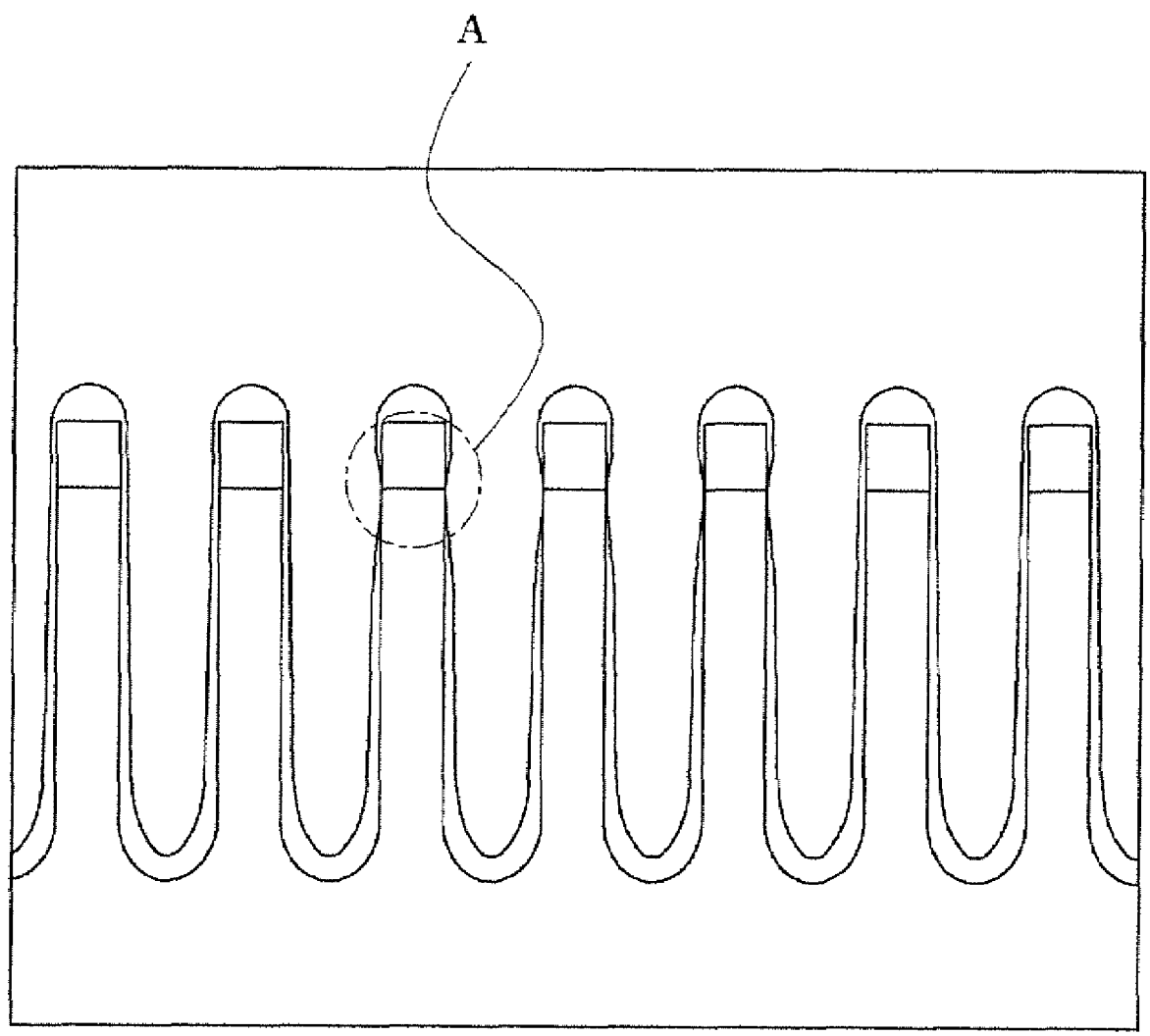
FIG. 1 is illustrating defects in a trench isolation layer according to the prior art.

Embodiments of the present invention will now be described in detail with reference to the accompanying drawings. However, the present invention may be embodied into a variety of different embodiments, and is not limited to the following description. In the drawings, the thickness of each element is enlarged for a better understanding of several layers and regions. Throughout the disclosure, the same or similar elements are denoted by the same reference numerals.

FIGS. 2 to 11 are views illustrating a method for forming an isolation layer in a semiconductor device according to an embodiment of the present invention.

Figure 2:
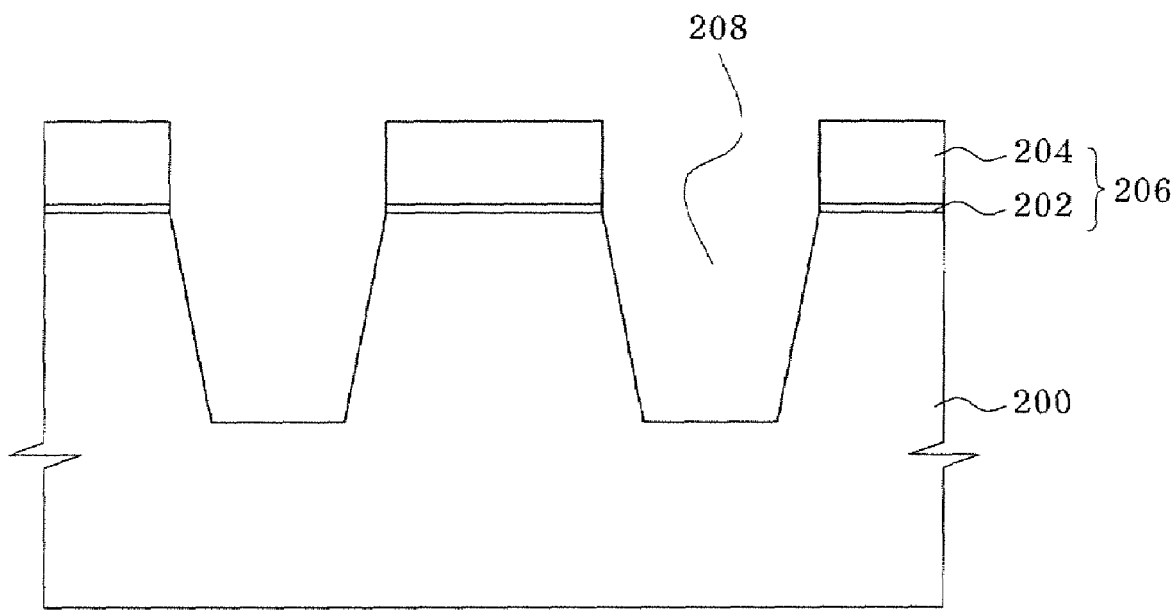
FIGS. 2 to 11 are views illustrating a method for forming an isolation layer in a semiconductor device according to an embodiment of the present invention.

Referring to FIG. 2, a mask layer pattern 206 is formed on a semiconductor substrate 200, to define a device isolation region.

More specifically, a pad oxide layer and a pad nitride layer are sequentially deposited over the semiconductor substrate 200. Here, the pad oxide layer serves to alleviate a stress of the semiconductor substrate 200 caused by attraction of the pad nitride layer. Although not shown in the drawings, since both the pad oxide layer and the pad nitride layer are formed in a furnace, they are further formed on a rear surface of the semiconductor substrate 200.

Next, a photosensitive layer is applied onto the pad nitride layer, and subsequently is subjected to patterning, so as to form a photosensitive layer pattern (not shown) for selectively exposing a surface of the pad nitride layer to the outside. In sequence, both the pad oxide layer and the pad nitride layer are etched through the photosensitive layer pattern as an etching mask, to form the mask layer pattern 206 including a pad oxide layer pattern 202 and a pad nitride layer pattern 204 such that a certain region of the semiconductor substrate 200 is exposed to the outside.

Then, the exposed region of the semiconductor substrate 200 is etched through the mask layer pattern 206 as an etching mask, to form a trench 208 having a predetermined depth in the semiconductor substrate 200.

Figure 3:
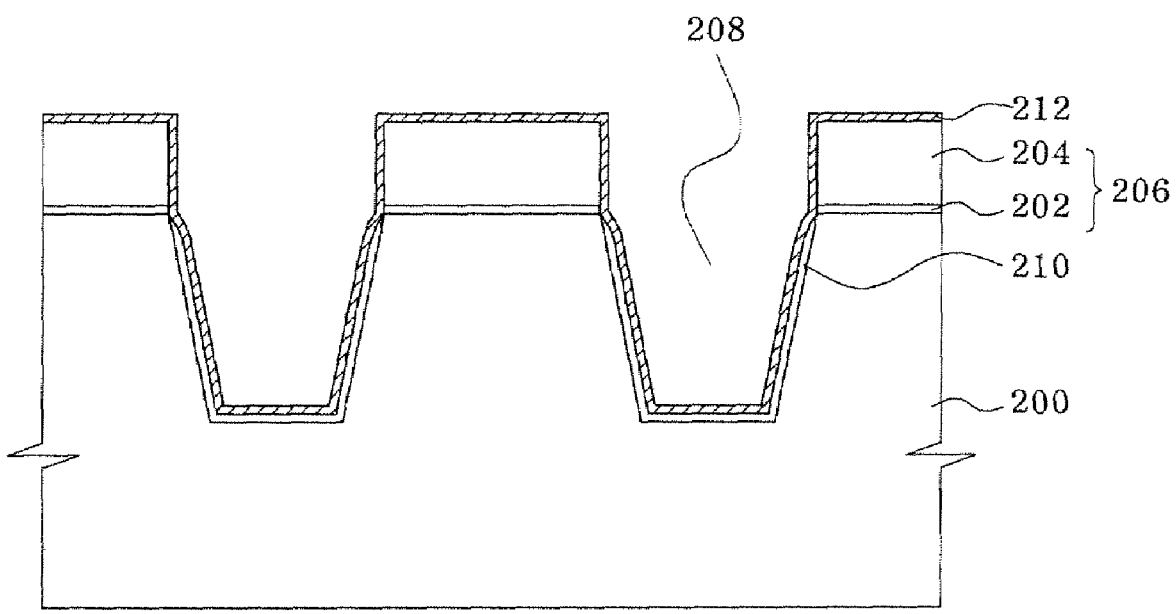

Referring to FIG. 3, the exposed region of the trench 208 is subjected to oxidation, to form a sidewall oxide layer 210 thereon. A first liner nitride layer 212 is deposited over the sidewall oxide layer 210. The sidewall oxide layer 210 serves as a buffer layer for preventing a stress caused when the first liner nitride layer 212 is directly deposited over the semiconductor substrate 200.

Figure 4:
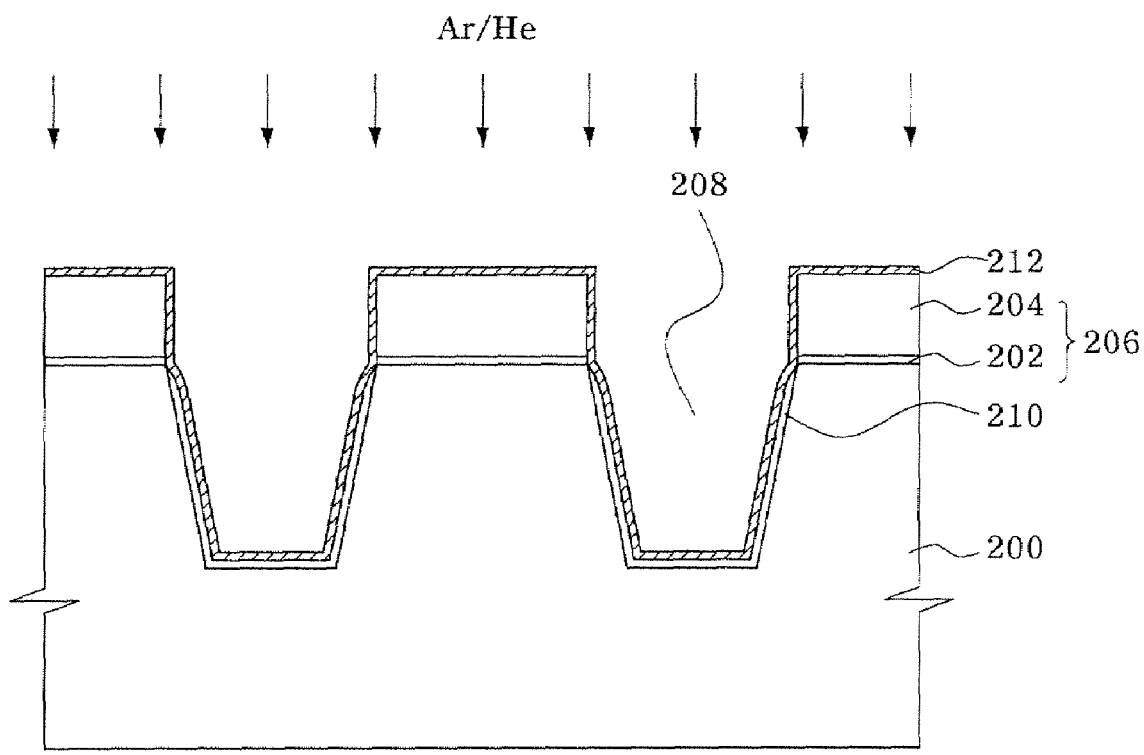

Referring to FIG. 4, the semiconductor substrate 200 is subjected to first preheating using argon (Ar)-containing inert gas.

More specifically, the semiconductor substrate 200 is loaded into a high-density plasma chamber. The semiconductor substrate 200 is subjected to first preheating for 50 to 60 seconds by introducing argon (Ar)-containing inert gas and helium (He) gas into the chamber while applying an appropriate voltage thereto. The argon (Ar)-containing inert gas is introduced at a flow rate of 40 sccm to 60 sccm, and the helium (He) gas is introduced at a flow rate of 300 sccm to 500 sccm. The top power applied to generate plasma is 2,000 W to 3,000 W, and the side power applied is 2,000 W to 3,000 W.

Figure 5:
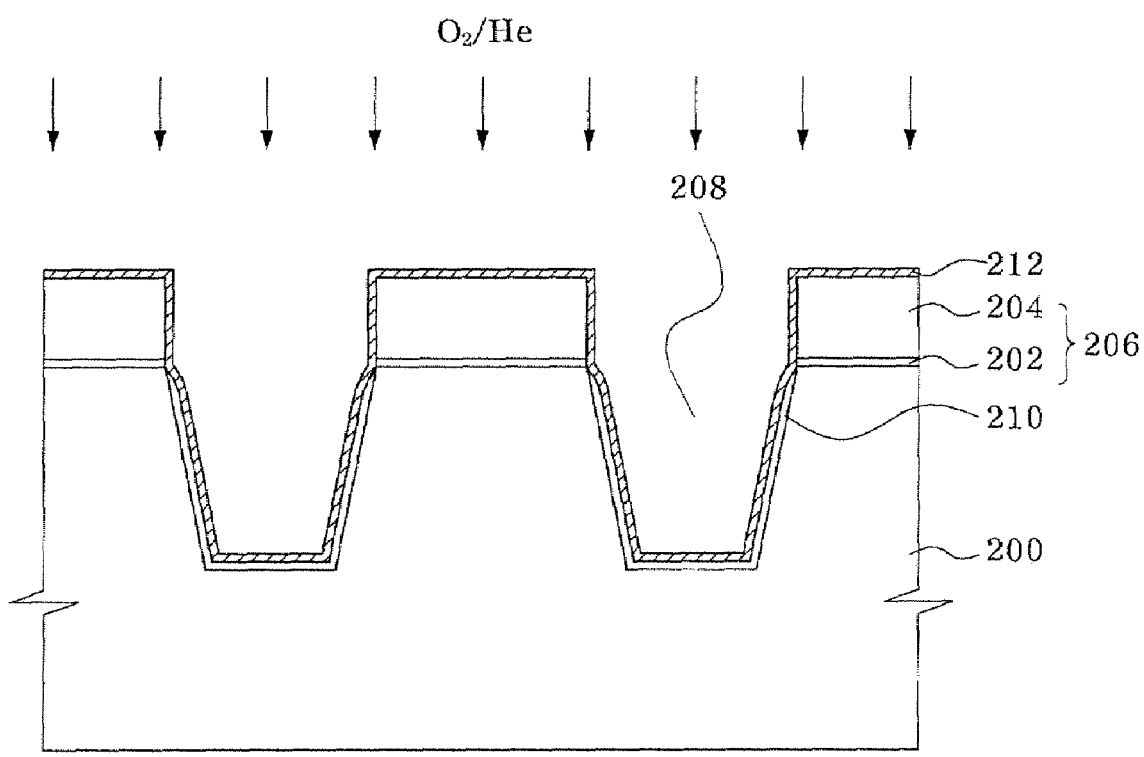

Referring to FIG. 5, the semiconductor substrate 200, having passed through the first preheating, is subjected to second preheating using oxygen ($O_2$) gas.

More specifically, the semiconductor substrate 200 is subjected to second preheating for 5 seconds to 10 seconds by introducing oxygen ($O_2$) gas and helium (He) gas into the high-density plasma chamber, in which the first preheating was carried out, while applying an appropriate voltage thereto. The oxygen ($O_2$) gas is introduced at a flow rate of 40 sccm to 60 sccm, and the helium (He) gas is introduced at a flow rate of 300 sccm to 500 sccm. The top power applied to generate plasma is 2,000 W to 3,000 W, and the side power applied is 2,000 W to 3,000 W.

Figure 6:
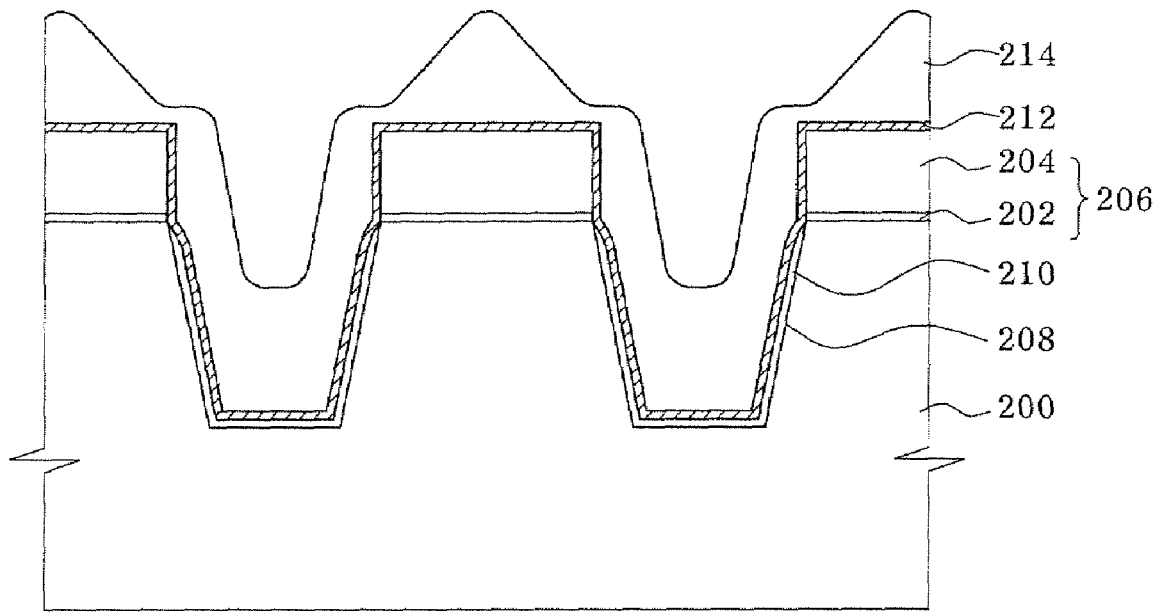

Referring to FIG. 6, a first HDP oxide layer 214 is formed on the semiconductor substrate 200 as well as the bottom surface and side surface of the trench 208 to partially fill the trench 208.

For this, a deposition source is introduced into the plasma chamber, in which the first preheating and the second preheating were carried out, to form a liner high density plasma (HDP) oxide layer to a thickness of 250 Å to 350 Å. The deposition source is further introduced into the chamber, to deposit a bulk HDP oxide layer to a thickness of 700 to 900 Å over the liner HDP oxide layer. Then, an etching source is introduced into the plasma chamber, to etch overhangs generated in the upper region of the trench in the course of forming the bulk HDP oxide layer.

Assuming that the deposition of the bulk HDP oxide layer over the trench 208 and the etching of overhangs generated in the upper region of the trench 208 constitute one cycle, this cycle is repeated more than four times, to form the first HDP oxide layer 214 over the bottom surface and side surface of the trench 208 and over the semiconductor substrate 200 for partially filling the trench 208.

Figure 7:
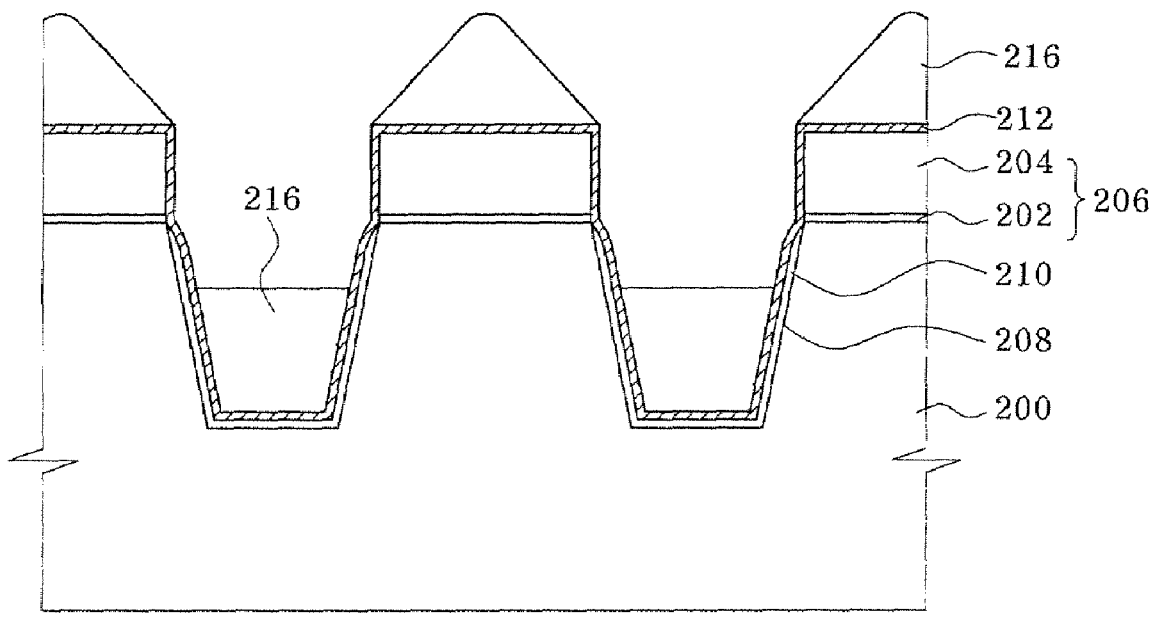

Referring to FIG. 7, the semiconductor substrate 200 is subjected to wet etching using a hydrofluoric acid (HF) solution, to remove overhangs remained without being removed in the course of forming the first HDP oxide layer 214. Here, the hydrofluoric acid (HF) solution may be a mixture of water ($H_2O$) and hydrofluoric acid (HF) in a ratio of 20:1. During the wet etching using the hydrofluoric acid (HF) solution, the first HDP oxide layer 214 over the side surface of the trench 208 may be removed. Also, in the course of removing the first HDP oxide layer 214 from the side surface of the trench 208, the first liner nitride layer 212 over the side surface of the trench 208 may be attacked by the hydrofluoric acid (HF) solution, thus having a risk of being partially removed.

Figure 8:
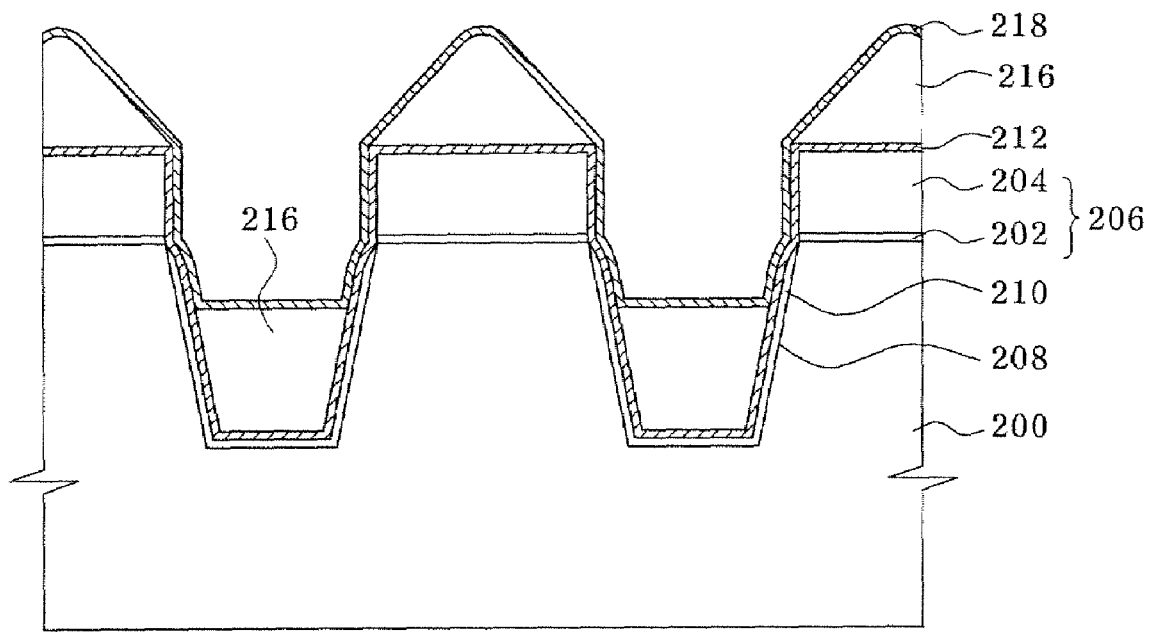

Referring to FIG. 8, a second liner nitride layer 218 is deposited over the first HDP oxide layer 214.

For this, first, the semiconductor substrate 200 loaded in the plasma chamber is subjected to annealing in an ammonia ($NH_3$) gas atmosphere. The annealing process may be carried out for approximately 1 hour at a temperature of 700 to 800 degrees centigrade while introducing ammonia ($NH_3$) gas into the plasma chamber at a flow rate of 800 sccm to 1000 sccm. Then, a liner nitride layer deposition source is introduced into the plasma chamber that is kept at a process temperature of 600 to 700 degrees centigrade, so as to deposit the second liner nitride layer 218 to a thickness of 20 Å to 40 Å over the first HDP oxide layer 214. The liner nitride layer deposition source contains nitrogen ($N_2$) gas, dichlorosilane ($SiH_2Cl$) gas, and ammonia ($NH_3$) gas. In this case, the nitrogen ($N_2$) gas is introduced at a flow rate of 800 sccm to 1000 sccm, the dichlorosilane ($SiH_2Cl$) gas is introduced at a flow rate of 80 sccm to 100 sccm, and the ammonia ($NH_3$) gas is introduced at a flow rate of 40 sccm to 60 sccm.

The second liner nitride layer 218, formed as described above, serves as a barrier layer for covering the exposed portion of the first liner nitride layer 212 and the side surface of the trench 208, having no first HDP oxide layer 214, during the wet etching using the hydrofluoric acid (HF) solution. Accordingly, it is possible to prevent an occurrence of defects such as pin holes that may be caused when the exposed portion of the first liner nitride layer 212 is attacked by the hydrofluoric acid (HF) solution. The second liner nitride layer 218 is also efficient to achieve improved barrier characteristics because it covers the first liner nitride layer 212 having a loosely changed density.

Figure 9:
Figure 9:
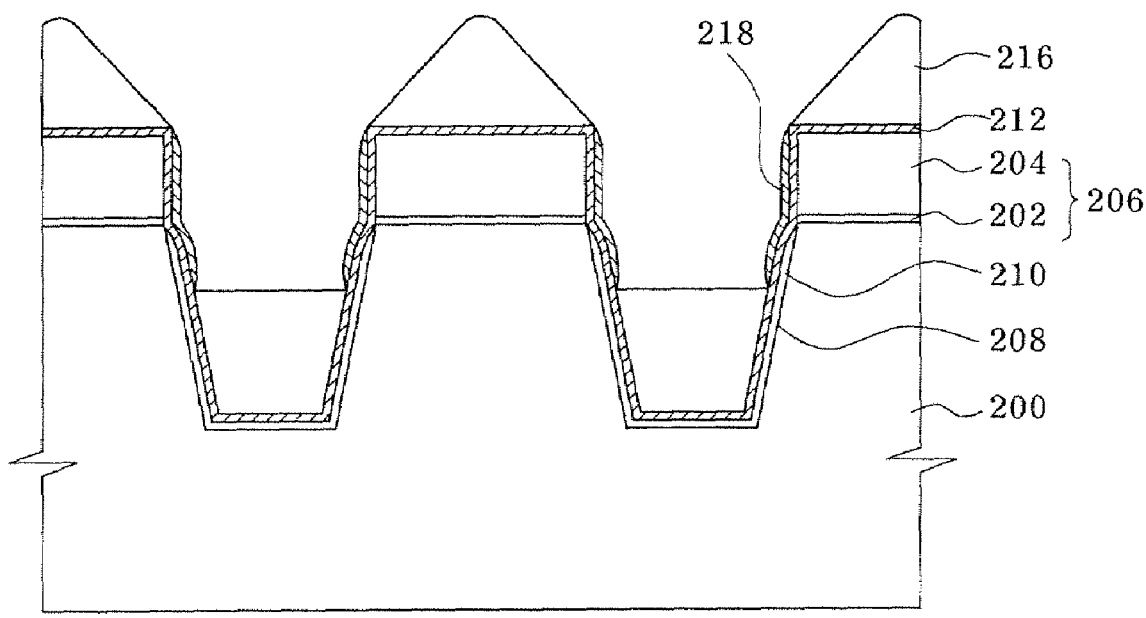

Referring to FIG. 9, the semiconductor substrate 200 is subjected to third preheating, to remove the second liner nitride layer 218 formed on the first HDP oxide layer 214.

The third preheating is carried out for 15 to 25 seconds by introducing helium (He) gas and oxygen ($O_2$) gas into the plasma chamber while applying an appropriate power thereto. The helium (He) gas is introduced at a flow rate of 400 sccm to 600 sccm, and the oxygen ($O_2$) gas is introduced at a flow rate of 200 sccm to 400 sccm. The power applied to the plasma chamber to generate plasma is 4,000 W to 5,000 W at a low frequency (LF). Sequentially, the power applied at a high frequency (HF) is 200 W to 400 W such that the plasma in the chamber is absorbed onto the semiconductor substrate 200.

As compared to a conventional plasma generating method which is carried out for 60 seconds by introducing helium (He) gas at a flow rate of approximately 325 sccm and oxygen ($O_2$) gas at a flow rate of approximately 475 sccm while applying power of 4,000 W at a low frequency, the third preheating in accordance with an embodiment of the present invention uses an increased amount of helium gas and a reduced amount of oxygen gas. Also, when applying power of 250 to 350 W at a high frequency (HF), the preheating is able to be carried out with a high directivity.

While carrying out the high-directivity preheating, the second liner nitride layer 218 over the first HDP oxide layer 214 is oxidized and removed. If the second liner nitride layer 218 over the first HDP oxide layer 214 remains without being removed, the second liner nitride layer 218 still remains under an insulating layer that will be filled later in the trench 208. This has a risk of causing a cell to cell leakage. Also, in the case of a p-channel metal oxide semiconductor (PMOS) transistor in a peripheral circuit region, the second liner nitride layer may act as a trap site of a hot carrier, thereby causing a rapid deterioration of hot electron induced punch through (HEIP) of the PMOS transistor.

Figure 10:
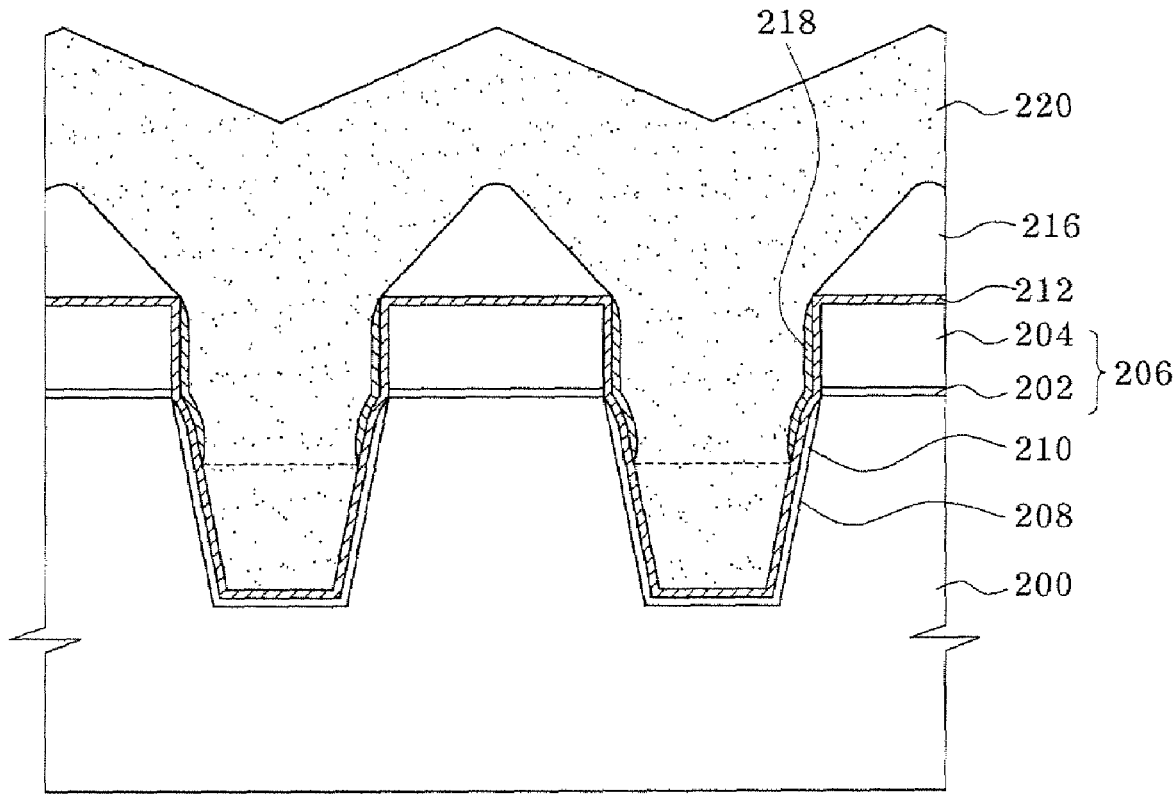

Referring to FIG. 10, a second HDP oxide layer 220 is formed to completely fill the remaining region of the trench 208. Here, the forming of the second HDP oxide layer 220 may be carried out in-situ, in addition to being carried out by the third preheating.

Figure 11:
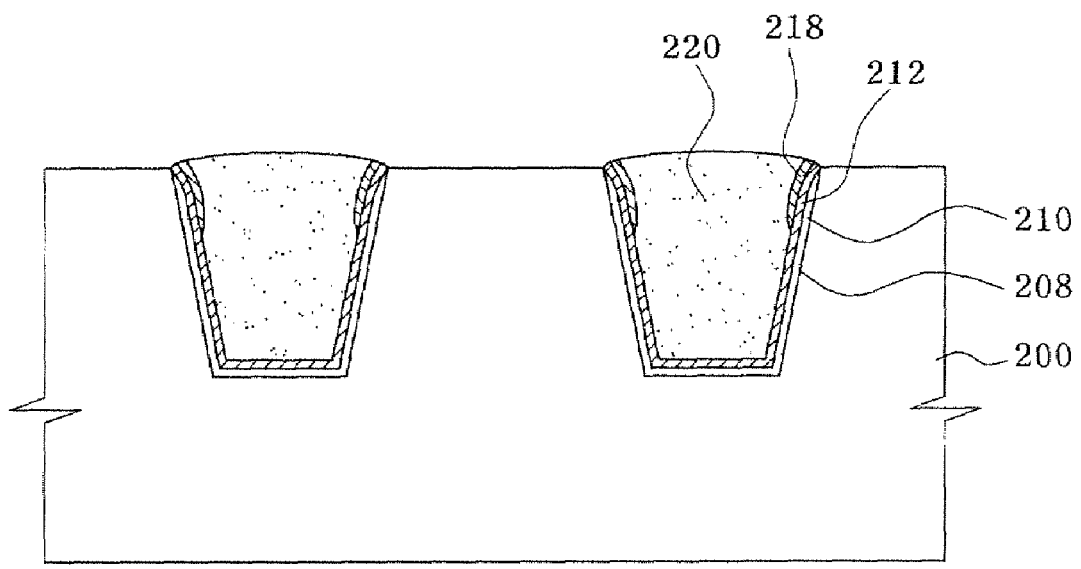

Referring to FIG. 11, the second HDP oxide layer 220 is subjected to planarization, to form a trench isolation layer 222.

For this, the second HDP oxide layer 220 is subjected to planarization until the surface of the semiconductor substrate 220 is exposed to the outside so as to form the trench isolation layer 222. Here, the planarization of the filled insulating layer may be carried out by chemical mechanical polishing (CMP) or etch-back.

In a method for forming an isolation layer in a semiconductor device according to embodiments of the present invention, a second liner nitride layer is additionally formed in the course of forming a high density plasma (HDP) oxide layer, the second liner nitride layer serving as a barrier layer covering the side surface of a trench, thereby preventing an occurrence of defects such as pin holes caused when a first liner nitride layer over the side surface of the trench is attacked by an etching solution. The second liner nitride layer further has the effect of preventing the density of the first liner nitride layer from being changed loosely.

As apparent from the above description, with the method for forming an isolation layer in a semiconductor device according to embodiments of the present invention, deposition and preheating of an additional liner nitride layer can be efficiently carried out. This has the effect of preventing not only an occurrence of defects caused when a liner nitride layer is attacked by an etching solution, but also the density of an underlying liner nitride layer from being changed loosely.

Although the present invention has been described herein in detail with reference to several preferred embodiments, those skilled in the art will appreciate that these embodiments do not serve to limit the invention and that various changes and modifications may be made thereto without departing from the spirit and scope of the invention as defined in the appended claims.

What is claimed is:

1. A method for forming an isolation layer in a semiconductor device comprising:
   forming a trench in a semiconductor substrate;
   forming a first liner nitride layer on an exposed surface of the trench and a semiconductor substrate;
   forming a first high density plasma (HDP) oxide layer such that the first HDP oxide layer partially fills the trench to cover a bottom surface and sides of the trench;
   etching overhangs generated during the forming of the first HDP oxide layer;
   forming a second liner nitride layer over the first HDP oxide layer and sidewalls of the trench where the first liner nitride is formed;
   removing the second liner nitride layer formed on the first HDP oxide layer while preheating the semiconductor substrate by introducing helium (He) gas and oxygen ($O_2$) gas;
   forming a second HDP oxide layer to fill the trench where the second liner nitride formed on the first HDP oxide layer is removed; and
   subjecting the second HDP oxide layer to planarization, so as to form a trench isolation layer.

2. The method according to claim 1, further comprising:
   prior to the forming of the first HDP oxide layer,
   preheating the semiconductor substrate.

3. The method according to claim 1, wherein the forming of the first HDP oxide layer comprises:
   loading the semiconductor substrate in a high density plasma chamber;
   depositing a liner high density plasma (HDP) oxide layer over the trench;
   introducing a deposition source into the high density plasma chamber, to form a bulk HDP oxide layer;
   introducing an etching source into the high density plasma chamber, to etch overhangs generated during the forming of the bulk HDP oxide layer; and
   repeating the deposition of the liner HDP oxide layer, the introduction of the deposition source, and the introduction of the etching source, to form the first HDP oxide layer partially filling the trench.

4. The method according to claim 1, wherein the forming of the second liner nitride layer comprises:
   annealing the semiconductor substrate in an ammonia ($NH_3$) gas atmosphere; and
   introducing a deposition source containing nitrogen gas, dichlorosilane gas, and ammonia gas into the semiconductor substrate, so as to form the second liner nitride layer.

5. The method according to claim 1, wherein the removal of the second liner nitride layer formed on the first HDP oxide layer is carried out by by applying a power of 4,000 to 5,000 W at a low frequency to generate plasma and a power of 200 to 400 W at a high frequency to allow the plasma to be adsorbed onto the semiconductor substrate.

6. The method according to claim 1, wherein the etching overhangs is performed by introducing a hydrofluoric acid (HF) solution into the semiconductor substrate.

7. The method according to claim 2, wherein the preheating comprises:
   first preheating by introducing argon (Ar)-containing inert gas into the semiconductor substrate; and
   second preheating by introducing oxygen ($O_2$) gas into the semiconductor substrate.

* * * * *